United States Patent
Maerz et al.

(10) Patent No.: US 9,882,556 B2
(45) Date of Patent: Jan. 30, 2018

(54) INTEGRATED MAGNETIC FIELD SENSOR-CONTROLLED SWITCH DEVICES

(71) Applicant: Infineon Technologies AG, Neubiberg (DE)

(72) Inventors: Sebastian Maerz, Berg (DE);
Jean-Marie Le Gall, Singapore (SG);
Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/884,966

(22) Filed: Oct. 16, 2015

(65) Prior Publication Data
US 2016/0087621 A1    Mar. 24, 2016

Related U.S. Application Data

(63) Continuation of application No. 13/366,917, filed on Feb. 6, 2012, now Pat. No. 9,203,394, which is a
(Continued)

(51) Int. Cl.
*H03K 17/082* (2006.01)
*H03K 17/90* (2006.01)
(Continued)

(52) U.S. Cl.
CPC ....... *H03K 17/0822* (2013.01); *H01L 25/165* (2013.01); *H03K 17/90* (2013.01);
(Continued)

(58) Field of Classification Search
CPC .... G01R 33/0047; G01R 33/06; G01R 33/07; H03K 17/0822; H03K 17/90; H03K 17/9517; H01L 25/165
(Continued)

(56) References Cited

U.S. PATENT DOCUMENTS

| 4,873,474 A | 10/1989 | Johnson |
| 6,738,246 B1 | 5/2004 | Struempler |

(Continued)

FOREIGN PATENT DOCUMENTS

| CN | 201385577 Y | 1/2010 |
| CN | 203135836 U | 8/2013 |

OTHER PUBLICATIONS

Notice of Allowance dated Jul. 19, 2016 U.S. Appl. No. 15/041,825.
(Continued)

*Primary Examiner* — Bo Fan
(74) *Attorney, Agent, or Firm* — Eschweiler & Potashnik, LLC

(57) ABSTRACT

Embodiments relate to integrated magnetic field sensor-controlled switch devices, such as transistors, current sources, and power switches, among others. In an embodiment, a magnetic switch and a load switch are integrated in a single integrated circuit device. In embodiments, the device can also include integrated load protection and load diagnostics. Embodiments can provide load switching and optional simultaneous logic signaling, for example to update a microcontroller or electronic control unit (ECU), while reducing space and complexity and thereby cost.

14 Claims, 7 Drawing Sheets

Related U.S. Application Data continuation-in-part of application No. 13/267,308, filed on Oct. 6, 2011, now Pat. No. 9,294,087.

(51) Int. Cl.
*H03K 17/95* (2006.01)
*H01L 25/16* (2006.01)
*H03K 17/08* (2006.01)

(52) U.S. Cl.
CPC .. *H03K 17/9517* (2013.01); *H01L 2924/0002* (2013.01); *H03K 2017/0806* (2013.01); *H03K 2217/0063* (2013.01); *Y10T 29/49117* (2015.01)

(58) Field of Classification Search
USPC .......................... 341/110; 324/247, 251, 252
See application file for complete search history.

(56) References Cited

U.S. PATENT DOCUMENTS

| | | | |
|---|---|---|---|
| 2004/0196605 A1* | 10/2004 | Dinn | G08C 17/04 361/91.1 |
| 2008/0125288 A1 | 5/2008 | Case | |
| 2009/0295380 A1 | 12/2009 | Motz et al. | |
| 2011/0215955 A1 | 9/2011 | Motz et al. | |
| 2011/0234218 A1* | 9/2011 | Lagouge | G01R 33/072 324/247 |
| 2011/0254611 A1 | 10/2011 | Volkmann | |
| 2012/0182658 A1 | 7/2012 | Motz | |
| 2013/0239702 A1 | 9/2013 | Ausserlechner | |

OTHER PUBLICATIONS

Infineon, Smart High-Side Power Switch BTS4140N, Smart High-Side Power Switch One Channel: 1 x 1Omega, dated May 29, 2007, 20 pages.

Infineon, Hall Switches for Automobile, Industrial, and Consumer Applications, as available on Oct. 6, 2011, at www.infineon.com, 5 pages.

Magnasphere Corp., Technology Overview: Magnasphere, available at www.Magnasphere.com, revised Feb. 18, 2010, 2 pages.

Notice of Allowance for U.S. Appl. No. 13/366,917 dated Jul. 17, 2015.

* cited by examiner

INTEGRATED MAGNETIC FIELD SENSOR-CONTROLLED SWITCH DEVICES

REFERENCE TO RELATED APPLICATION

This application is a continuation of U.S. application Ser. No. 13/366,917 filed on Feb. 6, 2012, which is a continuation-in-part of U.S. application Ser. No. 13/267,308 filed on Dec. 6, 2011, the contents of which are incorporated by reference in their entirety.

FIELD

The invention relates generally to switch devices and more particularly to magnetic field sensor-controlled switch devices.

BACKGROUND

Semiconductor Hall sensors are currently used for logic signaling but typically are able to switch only a limited load current. Therefore, two separate devices are currently used: a Hall sensor and a load switching integrated circuit (IC). Usually, in operation, a Hall sensor signal indicative of a switching state is received by a microcontroller which in turn activates the load switching IC. The Hall sensor and the load switching IC are typically soldered on a printed circuit board (PCB). Such a configuration uses more board and package space than is desired and is more complex in terms in of periphery space and wiring, each of which in turn leads to a higher cost.

Therefore, there is a need for improved power switches that take advantage of the robustness and reliability of magnetic field sensors like Hall sensors.

SUMMARY

Embodiments relate to integrated magnetic field sensor-controlled switch devices, such as transistors, current sources, and power switches, among others.

In an embodiment, a magnetic field sensor-controlled device comprises an integrated circuit package; magnetic switch circuitry disposed in the package; and load switch circuitry coupled to the magnetic switch circuitry and disposed in the package.

In an embodiment, a method comprises sensing a magnetic field by a sensor disposed in a package; sending a signal related to the magnetic field by the sensor to a load switch disposed in the package; and selectively switching a load by the load switch according to the signal from the sensor.

In an embodiment, an integrated circuit comprises magnetic field switching circuitry comprising a magnetic field sensor element; load switching circuitry coupled to the magnetic field switching circuitry; and an integrated circuit package housing the magnetic field switching circuitry and the load switching circuitry.

In an embodiment, a magnetic field sensor-controlled device comprises an integrated circuit package; magnetic field switch circuitry arranged in the package; load switch circuitry arranged in the package and coupled to the magnetic field switch circuitry; and a back bias magnetic material coupled to the package.

BRIEF DESCRIPTION OF THE DRAWINGS

The invention may be more completely understood in consideration of the following detailed description of various embodiments of the invention in connection with the accompanying drawings, in which.

Figure 1A:
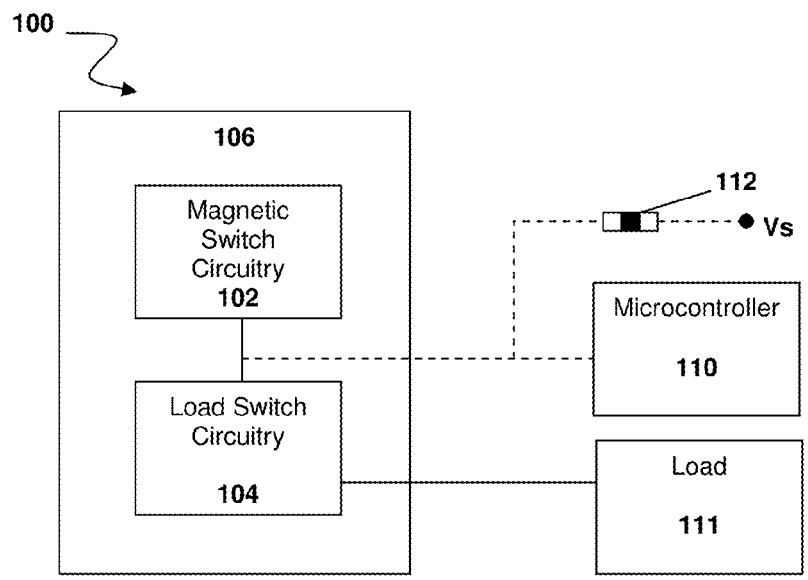
FIG. 1A is a block diagram of an integrated magnetic sensor switch device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to integrated magnetic field sensor-controlled switch devices, such as transistors, current sources, and power switches, among others. In an embodiment, a magnetic switch and a load switch are integrated in a single integrated circuit device. In embodiments, the device can also include integrated load protection and load diagnostics. Embodiments can provide load switching and optional simultaneous logic signaling, for example to update a microcontroller or electronic control unit (ECU), while reducing space and complexity and thereby cost.

Figure 1B:
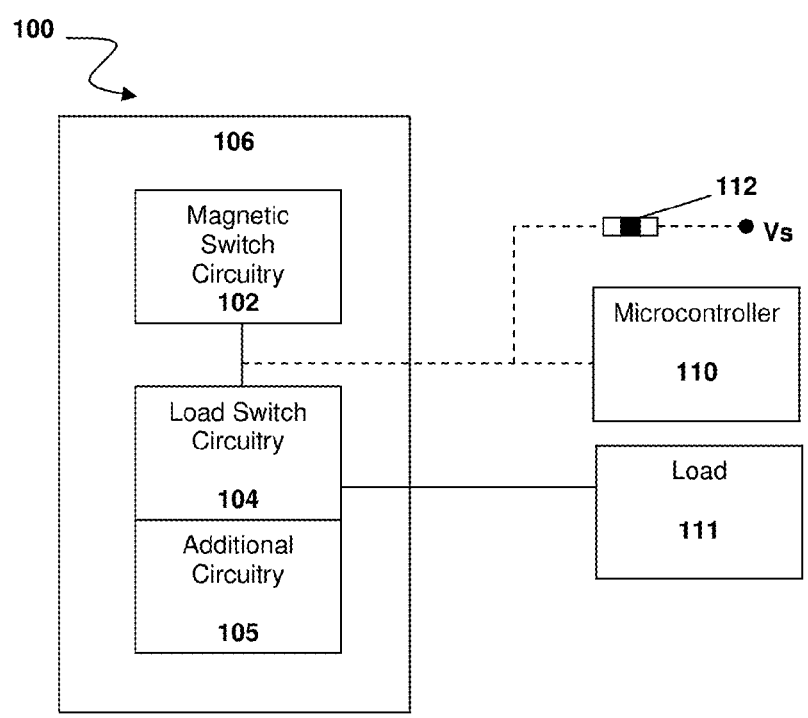
FIG. 1B is a block diagram of an integrated magnetic sensor switch device according to an embodiment.
Figure 2:
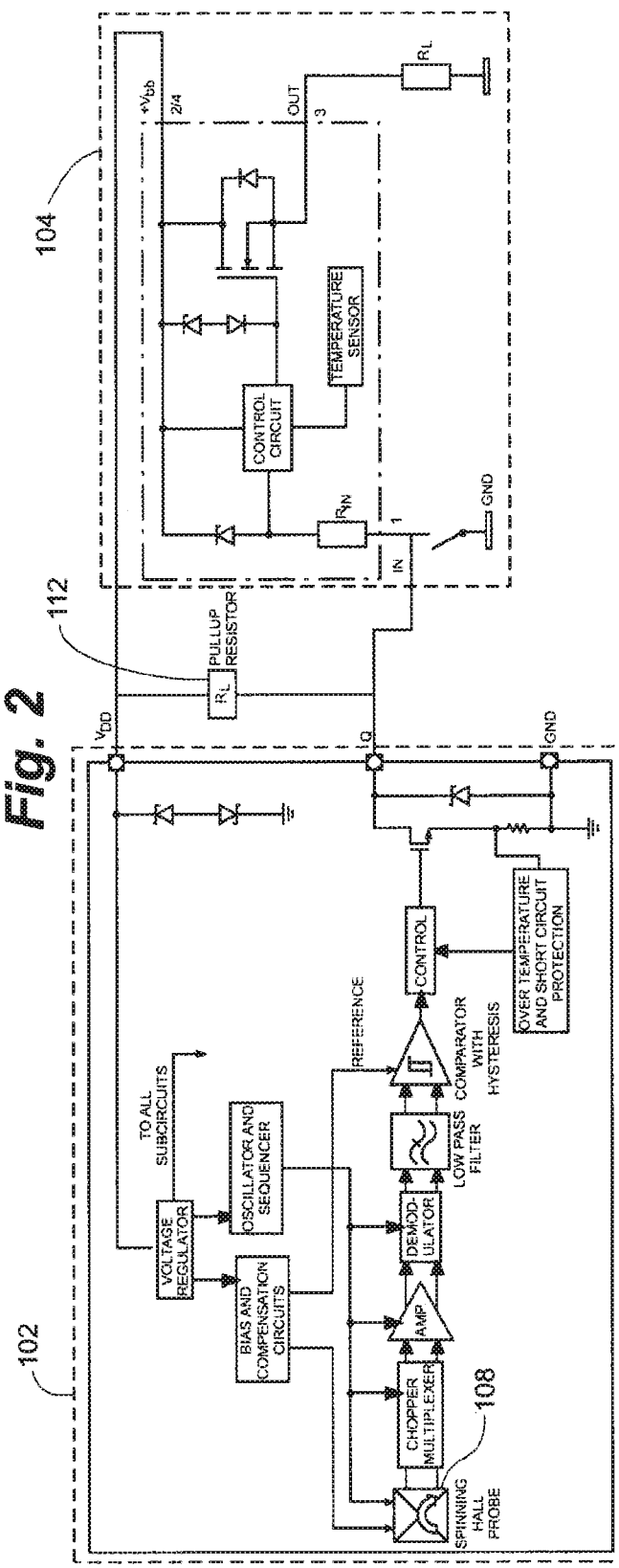
FIG. 2 is a circuit block diagram of an integrated magnetic sensor switch device according to an embodiment.

Referring to FIGS. 1A, 1B and 2, a block diagram of a magnetic field sensor-controlled switch device 100 according to an embodiment is depicted. Device 100 comprises magnetic switch circuitry 102 and load switch circuitry 104 integrated in a single package 106 in an embodiment. In the embodiment of FIG. 1B, device 100 also comprises additional circuitry 105, which in embodiments can comprise at least one of additional load switch circuitry, integrated load protection circuitry or integrated load diagnostics disposed in package 106.

Magnetic switch circuitry 102 can comprise a Hall-effect sensor, a magnetoresistive (xMR) sensor, a magnetodiode, a magnetotransistor, a magnetic field-sensitive MOSFET (MAGFET) or some other suitable magnetic field or other sensor device in various embodiments. In embodiments, the sensor can further comprise a differential or gradiometric sensor device having multiple sensing elements, which can be more robust against interference magnetic fields. In the embodiment of FIG. 2, magnetic switch circuitry 102 comprises at least one Hall-effect sensor element 108, such as a Hall plate or a vertical Hall device, configured to detect a position of a magnet. In embodiments, magnetic switch circuitry 102 is configured to act as a switch and to provide switch logic level information to an external microcontroller 110, though this latter feature can be omitted in other embodiments.

Load switch circuitry 104, in embodiments, comprises a transistor, such as a field effect transistor (FET), linear current control circuitry, an active power switch such as a high-side power switch, an nMOS device, a pMOS device, a linear current source, a switched current source or some other suitable device configured to switch or other control a load 111. For example, load switch circuitry 104 can comprise a power FET in one embodiment. While device 100 is depicted comprising a single load switch circuitry 104 block, other embodiments can comprise a plurality of load switch circuitry 104 blocks, which can be desired in some applications.

In embodiments, switch 100 also comprises a pull-up resistor 112. As depicted in FIGS. 1A and 1B, pull-up resistor 112 is external to package 106. In other embodiments, pull-up resistor 112 is integrated with magnetic switch circuitry 102 and load switch circuitry 104 in package 106.

Magnetic switch circuitry 102 and load switch circuitry 104 can be configured within package 106 in various ways. For example, embodiments can comprise single-, dual- or multi-die configurations, including chip-on-chip, chip-by-chip and other suitable arrangements. For example, it can be desired in some embodiments for circuitries 102 and 104 to comprise different technologies, such as power technologies with thicker metal layers, particular features (e.g., DMOS or VMOS) and/or non-silicon technologies (e.g., GaN, silicon carbide or GaAs) for load switch circuitry 104 and CMOS, such as for Hall or xMR sensors. In these and other embodiments, logic, EEPROM and other circuitry can be implemented on a die with magnetic switch circuitry 102, where more functions can be implemented on a smaller die size and in less expensive technology, to reduce cost, though this is exemplary of only some embodiments and can vary in others. Separate dies, split, specially shaped and/or non-magnetic leadframes and other configurations and arrangements within package 106 can also be used in particular embodiments to improve desired thermal characteristics, such as thermal resistance, temperature crosstalk, thermal coupling and thermal isolation, and/or electromagnetic compatibility (EMC), among others.

Figure 3A:
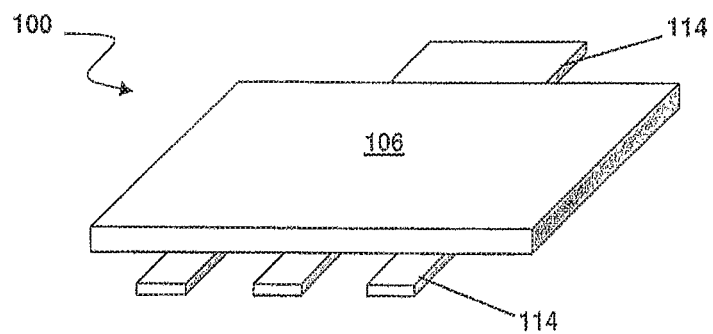
FIG. 3A is a diagram of a magnetic switch device package according to an embodiment.
Figure 3B:
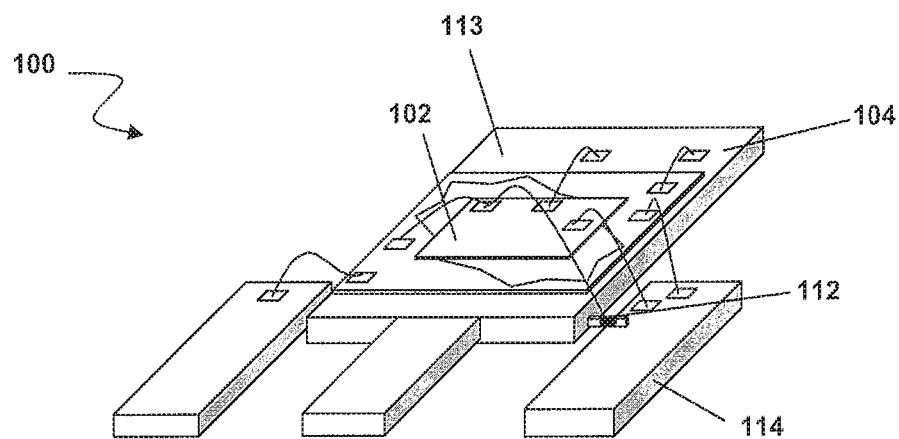
FIG. 3B is a diagram of the magnetic switch device of FIG. 3A without the package according to an embodiment.

Referring to FIGS. 3A and 3B, device 100 can comprise a chip-on-chip configuration of magnetic switch circuitry 102 and load switch circuitry 104 on a leadframe 113, with an internal pull-up resistor 112 within package 106. The relative chip-on-chip arrangement of circuitries 102 and 104 can vary in other embodiments. Switch 100 can alternatively comprise an external pull-up resistor 112. In one embodiment, device 100 is formed on a single semiconductor die, while in other embodiments a plurality of dies are used.

Figure 4A:
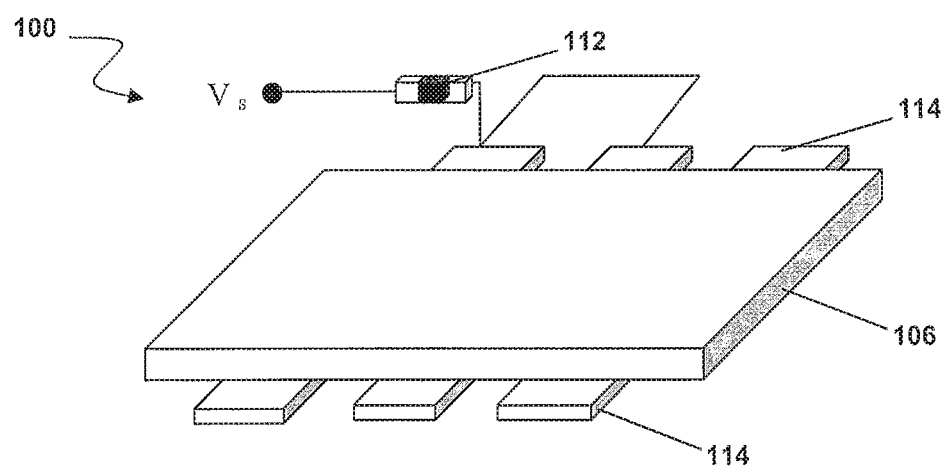
FIG. 4A is a diagram of a magnetic switch device package according to an embodiment.
Figure 4B:
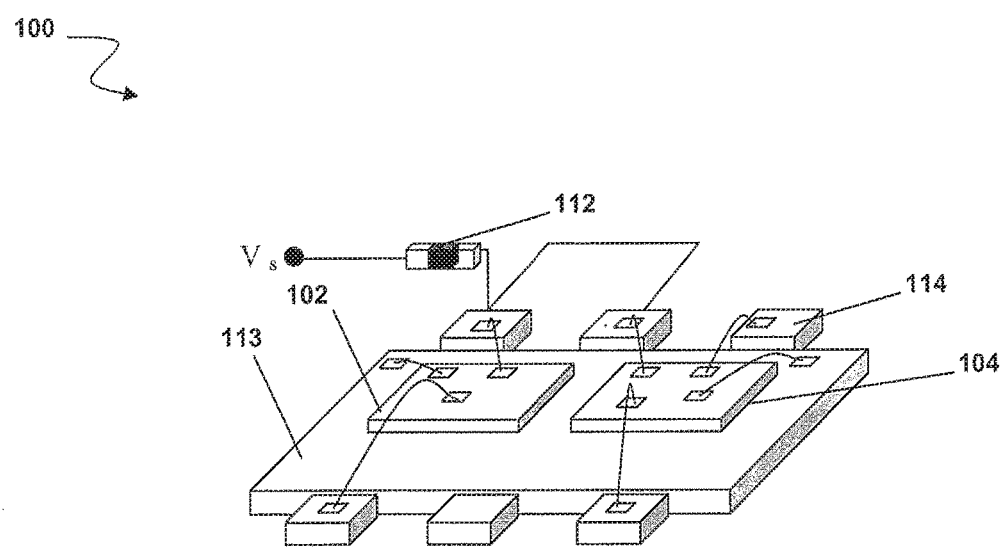
FIG. 4B is a diagram of the magnetic switch device of FIG. 4A without the package according to an embodiment.

Referring to FIGS. 4A and 4B, device 100 can comprise a chip-by-chip configuration of Hall switch circuitry 102 and load switch circuitry 104 on leadframe 113, with an internal or external pull-up resistor 112 (depicted as external in FIGS. 4A and 4B).

Figure 5:
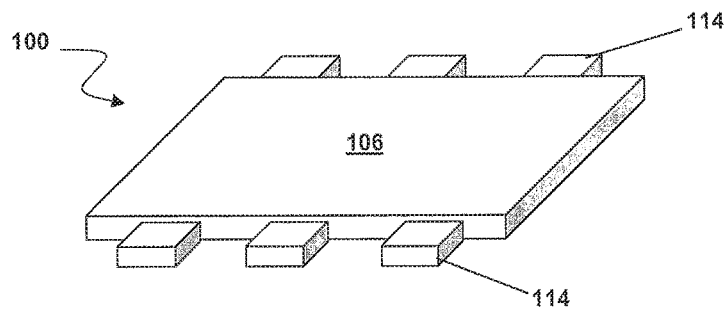
FIG. 5 is a diagram of a magnetic switch device package according to an embodiment.

In FIG. 5, one of magnetic switch circuitry 102 and load switch circuitry 104 (not visible) can be mounted on top of the leadframe while the other is mounted on the bottom. In can be advantageous, for example, to mount magnetic switch circuitry 102 on top of the leadframe such that it can be positioned closer to the magnet to minimize the air gap, with load switch circuitry on the bottom to dissipate more heat to the board.

Different coupling arrangements of magnetic switch circuitry 102 and load switch circuitry 104 can also be implemented in other embodiments. In one embodiment, load switch circuitry 104 can be coupled electrically in series with a current rail of magnetic switch circuitry 102. Such a configuration can be used to monitor the current and switch it off if it becomes too large or exhibits some other undesirable feature. In another embodiment, a single terminal of the load switch circuitry 104 can be coupled with the current rail of magnetic switch circuitry 102. Such a configuration can be more versatile by providing end users with the option of connecting the current rail and load switch circuitry 104 in series, parallel or some other desired configuration. In some embodiments, the current rail of magnetic switch circuitry 102 can be used as the die paddle for load switch circuitry 104, such that the die of load switch circuitry 104 is mounted onto the current rail. Such a configuration can provide a lower electrical resistance and thermal resistance of load switch circuitry 104. These embodiments are examples, and other embodiments can comprise these and/or other configurations.

Figures 6A, 6B:
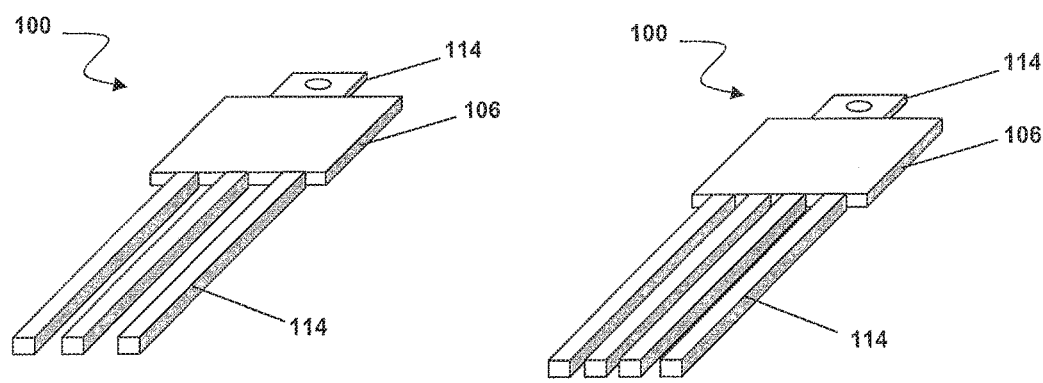
FIG. 6A is a diagram of a magnetic switch device package according to an embodiment.
FIG. 6B is a diagram of a magnetic switch device package according to an embodiment.
Figure 7:
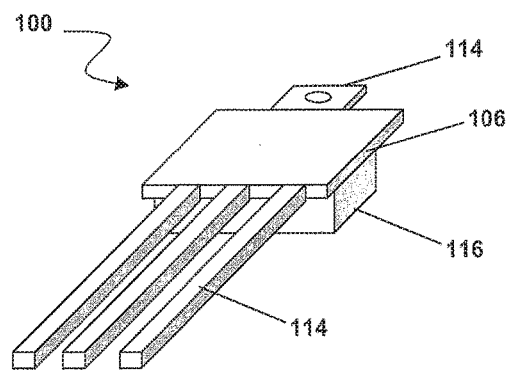
FIG. 7 is a diagram of a magnetic switch device package according to an embodiment.

The configuration of package 106 and leads 114, including the wirebonds as depicted, which can comprise other coupling types and configurations, can also vary in embodiments and/or applications, as appreciated by those skilled in the art. For example, some applications can require a particular external pull-up resistor, while others can select a particular configuration according to price sensitivity or some other characteristic. Device 100 can comprise virtually surface-mount device (SMD) in embodiments, with a variety of package and lead configurations and types. For example, FIGS. 6A and 6B depict three- and four-pin lead embodiments. Embodiments having extended lead lengths can be advantageous in embodiments in applications in which it is desired or required to have flexibility in the positioning of device 100. Longer leads provide more options for positioning, such as in remote locations, or the leads can be trimmed for more proximate locations. In another example, FIG. 7 depicts an integrated back bias (IBB) embodiment of device 100 and package 106, in which a magnet 116 is coupled in, on or to package 106.

In operation, a single integrated device 100 can signal load and logic in parallel. A load can be switched by load switching circuitry 104 by recognizing, by magnetic switch circuitry 102, the transgression of a magnetic field strength while, optionally, sending a logic signal to microcontroller 110 to indicate the change in state. Thus, the load can be driven and switched locally and directly by a single device, as opposed to conventional solutions in which a first device provides a logic signal to the microcontroller, which in turn signals a second device to switch a load.

Figure 8A:
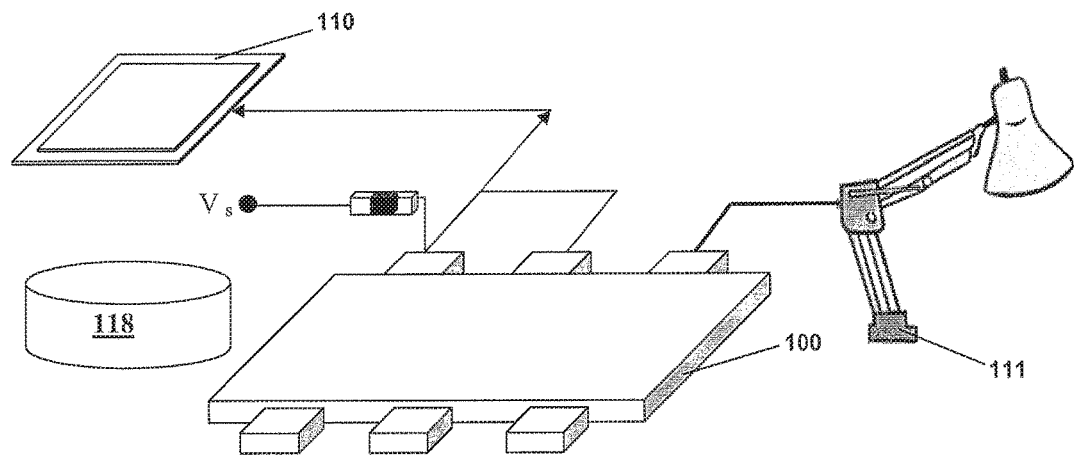
FIG. 8A is a diagram of an example implementation of a magnetic switch device according to an embodiment.
Figure 8B:
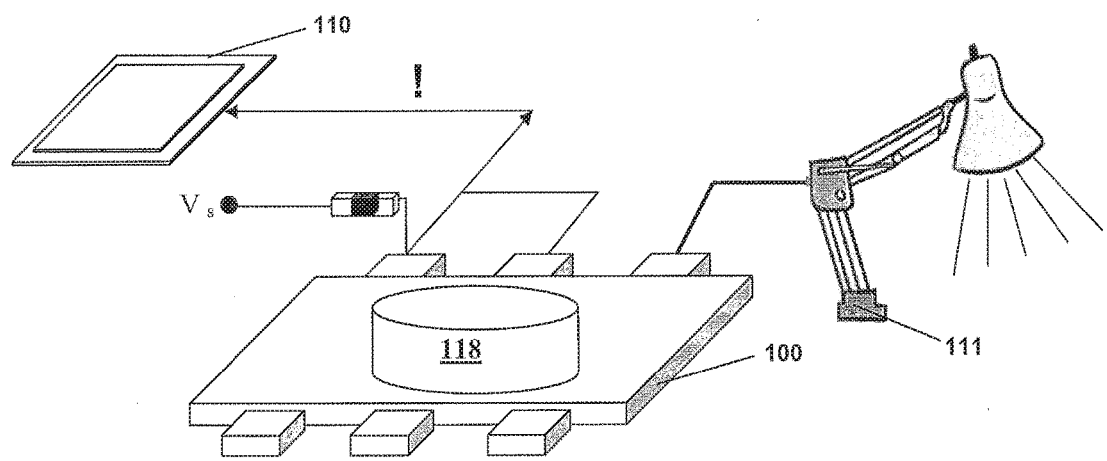
FIG. 8B is a diagram of an example implementation of a magnetic switch device according to an embodiment.

Referring to the example of FIGS. 8A and 8B, device 100 is coupled to a microcontroller 110 and a load 111. A varying magnetic field is represented by a magnet 118 In FIG. 8A, load 111 is switched off by device 100, whereas in FIG. 8B the change in magnetic field when magnet 118 shifts is sensed by magnetic switch circuitry 102 (not visible) such that, in parallel, the state of load 111 is switched, and microcontroller 110 is informed. In other embodiments, the switching can operate in the opposite manner or some other way, with FIGS. 8A and 8B being used to illustrate but one simplified example.

Switch 100 has many applications, including lighting, domestic appliance, lifestyle and automotive, among others. Specific, though non-limiting, examples include cosmetics mirrors, drawer and cupboard lighting, automotive and vehicular brake lights, and refrigerator/freezers. Switch 100 comprising a low-power magnetic switch can also be used for autonomous power saving lighting applications. Additionally, embodiments can be used as LED drivers, linear current sources or switching current regulators, such as for integrated magnetic LED switches. In some embodiments, loads can be about 100 mA to about 50 A or more, for example about 100 mA to about 5 A, or about 1 A to about 20 A, or some other range, with voltages of about 1 V to about 35 V or more, though these ranges can vary in other embodiments.

Embodiments provide many advantages. Cost savings can be realized with respect to conventional solutions because only a single package is necessary. The single package also requires less space, less wiring and fewer peripheries. For example, low-cost construction can include a solid-state relay mounting. With respect to functionality, the load is switched directly by the switch, rather than by a microcontroller, which becomes optional. In embodiments having a microcontroller, the microcontroller is always updated, and lifetime advantages can be realized in view of the robustness, reliability and durability of Hall switches as opposed to conventional mechanical solutions. Embodiments also provide improved controllability of switching activities.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An integrated circuit comprising:
   magnetic switch circuitry comprising a magnetic field sensor element;
   load switching circuitry coupled to the magnetic switching circuitry; and
   an integrated circuit package housing the magnetic switching circuitry and the load switching circuitry and comprising an output to couple the integrated circuit package to an external load to be controlled by the load switching circuitry switching the external load,
   wherein the magnetic field switching circuitry is configured to send a logic signal and a load-control signal in parallel by sending the logic signal in a first connection to a microcontroller and sending the load-control signal in a different second connection to the load switching circuitry in response to a change in a magnetic field.

2. The integrated circuit of claim 1, further comprising a die, wherein the magnetic field switching circuitry and load switching circuitry are formed on the die.

3. The integrated circuit of claim 1, further comprising a pull-up resistor housed in the package.

4. The integrated circuit of claim 1, wherein the magnetic field sensor element comprises at least one of a Hall-effect sensor element, a differential sensor element, a magnetoresistive sensor element, a magnetodiode device, a magnetotransistor device or a magnetic field-sensitive MOSFET device.

5. A magnetic field sensor-controlled device comprising:
   an integrated circuit package:
   magnetic field switch circuitry arranged in the package;
   load switch circuitry arranged in the package and coupled to the magnetic field switch circuitry; and
   a back bias magnetic material coupled to the package;
   wherein the magnetic field switching circuitry is configured to send a logic signal and a load-control signal in parallel by sending the logic signal in a first connection to a microcontroller and sending the load-control signal in a different second connection to load switching circuitry in response to a change in a magnetic field.

6. The magnetic field sensor-controlled device of claim 5, wherein the back bias magnetic material is coupled to the package within the package.

7. The integrated circuit of claim 5, wherein the magnetic field switch circuitry comprises at least one of a Hall-effect sensor element, a differential sensor element, a magnetoresistive sensor element, a magnetodiode device, a magnetotransistor device or a magnetic field-sensitive MOSFET device.

8. The integrated circuit of claim 1, further comprising additional load switching circuitry coupled to the magnetic switch circuitry and disposed in the integrated circuit package.

9. The magnetic field sensor-controlled device of claim 5, further comprising additional load switch circuitry coupled to the magnetic field switch circuitry and disposed in the package.

10. The integrated circuit of claim 1, further comprising a pull-up resistor coupled to the magnetic switch circuitry and the load switching circuitry, wherein the pull-up resistor is external to a die on which the magnetic switch circuitry resides and is external to a die on which the load switch circuitry resides, and wherein the pull-up resistor is disposed in the integrated circuit package within which the magnetic switch circuitry and the load switch circuitry reside.

11. The integrated circuit of claim 1, wherein at least one of the magnetic switch circuitry or the load switch circuitry comprise a temperature sensing circuit configured to generate a temperature output signal indicative of a sensed temperature and a control circuit configured to deactivate the at least one of the magnetic switch circuitry and the load switch circuitry, respectively, if the sensed temperature as indicated by the temperature output signal exceeds a predetermined threshold.

12. The integrated circuit of claim 1, wherein the load switch circuitry is coupled electrically in series with a current rail of the magnetic switch circuitry.

13. The integrated circuit of claim 1, wherein a current rail of the Magnetic switch circuitry comprises a die pad for the load switch circuitry, wherein a die of the load switch circuitry is mounted onto the current rail of the magnetic switch circuitry.

14. The integrated circuit of claim 1, further comprising at least one of integrated load protection circuitry or integrated load diagnostics disposed in the integrated circuit package.

* * * * *